(12) United States Patent
Freidhof et al.

(10) Patent No.: US 6,559,781 B2
(45) Date of Patent: May 6, 2003

(54) DEVICE AND METHOD FOR SAMPLING RATE CONVERSION

(75) Inventors: Markus Freidhof, Taufkirchen (DE); Kurt Schmidt, Grafing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/045,161

(22) Filed: Jan. 15, 2002

(65) Prior Publication Data

US 2002/0093437 A1 Jul. 18, 2002

(30) Foreign Application Priority Data

Jan. 18, 2001 (DE) ......................... 101 02 166

(51) Int. Cl.[7] .............................................. H03M 7/00
(52) U.S. Cl. ..................................................... 341/61
(58) Field of Search ........................... 341/61, 143, 111, 341/112, 113, 114; 375/350, 229; 708/313, 315, 300, 420

(56) References Cited

U.S. PATENT DOCUMENTS

| 5,786,778 A | * | 7/1998 | Adams et al. ................. 341/61 |
| 5,880,687 A | * | 3/1999 | May et al. ..................... 341/61 |
| 6,005,901 A | * | 12/1999 | Linz ............................. 375/355 |
| 6,057,789 A | | 5/2000 | Lin |
| 6,208,671 B1 | * | 3/2001 | Paulos et al. ................ 370/545 |
| 6,215,839 B1 | * | 4/2001 | Temerinace et al. ........ 375/326 |

FOREIGN PATENT DOCUMENTS

DE         692 21 526 T2        2/1998

* cited by examiner

Primary Examiner—Brian Young
Assistant Examiner—John B Nguyen
(74) Attorney, Agent, or Firm—Birch, Stewart, Kolasch & Birch, LLP

(57) ABSTRACT

A resampler (1) is used to convert a digital input signal string ($S_{in}$) with an input sampling rate ($f_{in}$) into a digital output signal string ($S_{out}$) with an output sampling rate ($f_{out}$). An estimating unit (11) estimates a sampling rate ratio ($R_k$) between the input sampling rate ($f_{in}$) and the output sampling rate ($f_{out}$) and a setpoint phase of the output signal string ($S_{out}$). A regulating unit (12) compares an actual phase of the output signal string ($S_{out}$) to the setpoint phase, and generates a control signal ($R_{TC,k}$) as a function of the estimated sampling rate ratio ($R_k$) and a deviation of the actual phase from the setpoint phase. An interpolator (7) interpolates the input signal string ($S_{in}$) for producing the output signal string ($S_{out}$) at sampling times whose temporal position is determined by the control signal ($R_{TC,k}$).

12 Claims, 4 Drawing Sheets

DEVICE AND METHOD FOR SAMPLING RATE CONVERSION

BACKGROUND OF THE INVENTION

This application claims a foreign priority based on German patent application no. 101 02 166.6, filed Jan. 18, 2001 and the contents of that application are incorporated herein by reference.

The invention concerns a device for converting a digital input signal string with an input sampling rate into a digital output signal string with an output sampling rate that is different from the input sampling rate. Such a device is generally called a resampler. The invention also relates to a corresponding method.

Such a resampler is known from European patent document EP 0 665 546 A2, for example. In a resampler, the relationship between the input sampling rate and the output sampling rate must first be determined. In the aforementioned document, this is accomplished through a gate time measurement. The sampled values are interpolated at the output sample times specified by the output sampling rate in an interpolator. In this process, the interpolator is controlled by a detected sampling rate ratio. Since the determination of the sampling rate ratio is subject to measuring inaccuracy, buffering takes place in a buffer store, for example a FIFO, located at the output of the interpolator in the case of down-sampling and at the input of the interpolator in the case of up-sampling. In this regard, the integral behavior of the FIFO memory is exploited. EP 0 665 546 A1 proposes regulating the sampling rate ratio that controls the interpolator as a function of a fill level of the buffer store.

The regulation of the sampling rate ratio as a function of the fill level of the buffer store proposed in EP 0 665 546 A2 has the disadvantage that when the fill level of the buffer store memory changes, the group propagation-time delay of the digital signal through the resampler changes. In applications such as mobile radio telephony, relatively large changes in buffer store fill level (e.g. +/−1), which is to say a change by one storage unit, are not tolerable since they lead to variations in propagation-time delay of the signal through the resampler. With the buffer store fill level controller proposed in EP 0 665 546 A1, deviations in a clock rate ratio are detected relatively late, after a relatively large detuning of the ratio has already taken place. This leads to larger interpolation errors due to incorrect sampling times.

Consequently, an object of the invention is to provide a device (resampler) and a method (resampling method) for converting a digital input signal string with an input sampling rate into a digital output signal string with an output sampling rate, which device and/or method functions with high precision.

SUMMARY OF THE INVENTION

According to principles of this invention, this object is attained with regard to the device through the features of claim 1, and with regard to the method through the features of claim 9. The dependent claims contain advantageous refinements of the device and/or the method.

The invention is based on the realization that precision in controlling the interpolator and/or in determining the sampling times of the output signal string can be significantly improved if the regulation is not performed solely on the basis of an estimate of the sampling rate ratio between the input sampling rate and the output sampling rate, but also simultaneously on the basis of an estimate of the phase angle. As a result of an inventive phase-coherent regulation, a deviation in the sampling rate ratio is detected before the deviation becomes large enough to lead to a rise or fall in the storage level in the buffer store (FIFO). A great change in the group propagation-time delay through the resampler associated with the change in storage level is thus avoided, and the interpolation precision of the interpolator is improved.

BRIEF DESCRIPTION OF THE DRAWINGS

An embodiment of the resampler and the resampling method in accordance with the invention is described below in detail with reference to the drawings. Shown in the drawings are.

DETAILED DESCRIPTION OF THE INVENTION

Figure 1:
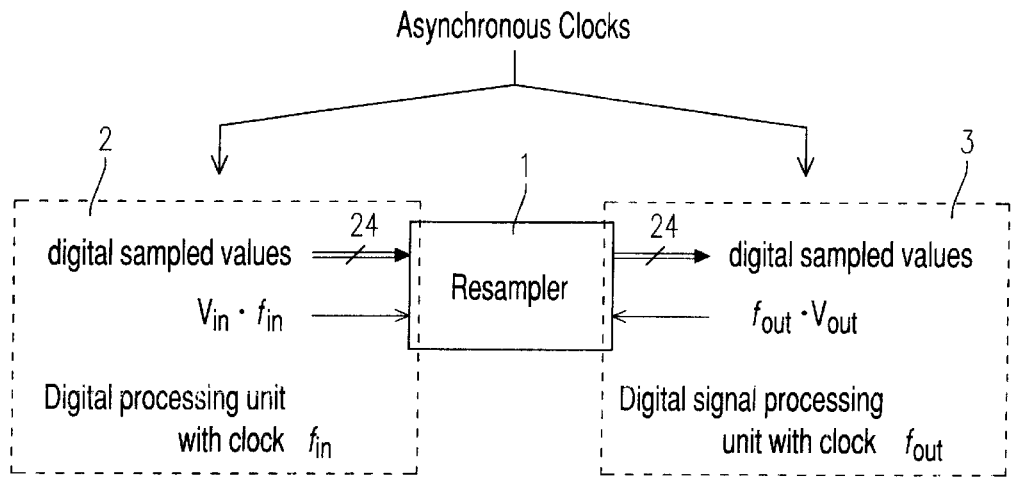
FIG. 1 is a schematic representation of a resampler.

FIG. 1 shows the basic principle of a resampler 1 on which the invention is based. A first digital signal-processing unit 2 operating with the clock $f_{in}$ and a second digital signal-processing unit 3 operating with the clock $f_{out}$ are connected to the resampler 1. The first digital signal-processing unit 2 generates digital sampled values, for example with a width of 24 bits, which are fed to the resampler 1. Moreover, the resampler (sampling rate converter) is provided with a clock $v_{in} \cdot f_{in}$ from the first digital signal-processing unit 2 and a clock $v_{out} \cdot f_{out}$ from the second digital signal-processing unit 3. $v_{in}$ and $v_{out}$ are integer, whole number, multiples and can preferably be equal to 1. The clocks $f_{in}$ and $f_{out}$ are in general asynchronous and have an arbitrary ratio to one another that in general is not an integer. The resampler 1 has the task of converting the digital sampled values of the first digital signal-processing unit 2 operating with the clock $f_{in}$ into digital sampled values of the second digital signal-processing unit 3 operating with the clock $f_{out}$. In the case that $f_{out}$ is smaller than $f_{in}$, we are talking about down-sampling. In the case that $f_{out}$ is larger than $f_{in}$, we are talking about up-sampling.

Figure 2:
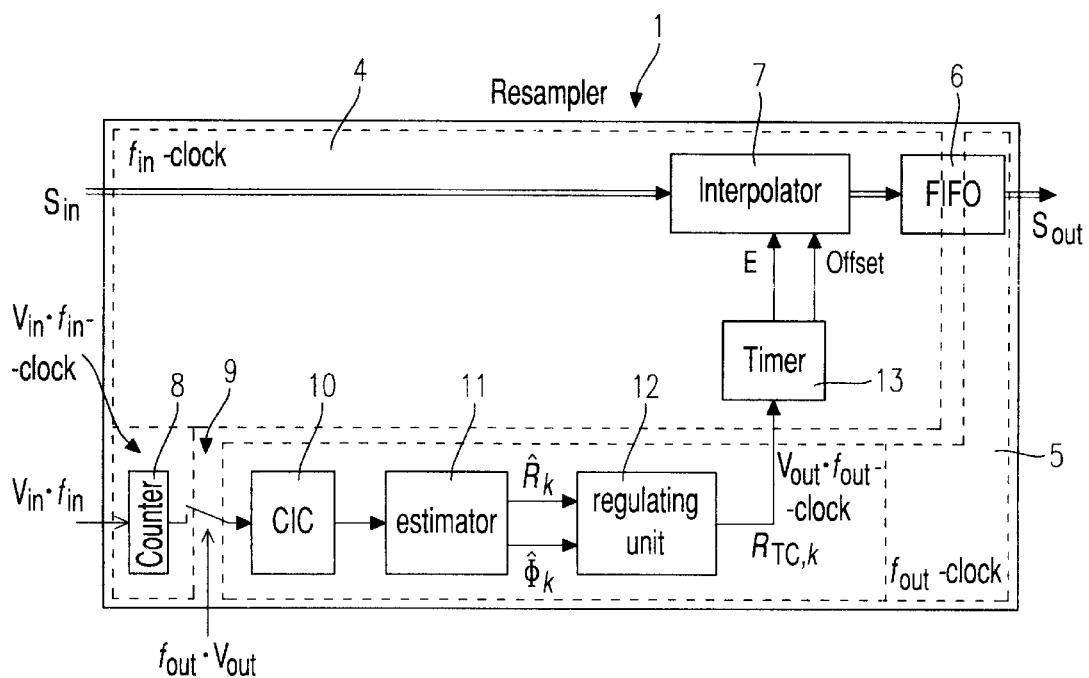
FIG. 2 is a block diagram of a resampler in accordance with the invention.
Figure 8:
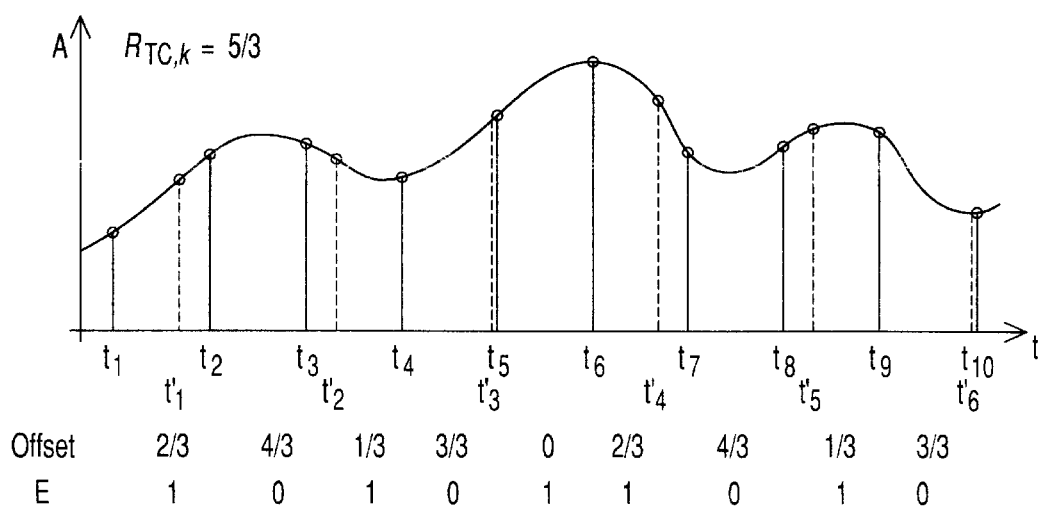
FIG. 8 is a diagram explaining the method of operation of the timing control unit shown in FIG. 4.

FIG. 2 shows an embodiment of a resampler 1 in accordance with the invention. The case of down-sampling is depicted. A first block 4 of the resampler 1 works at the input clock $f_{in}$, while a second block 5 of the resampler 1 works at the output clock $f_{out}$. The digital input signal string $S_{in}$ supplied to the resampler 1 is fed to an interpolator 7 with the clock $f_{in}$. An interpolation to generate the sampled values of the output signal string $s_{out}$ at the sampling times corresponding to the output sampling rate $f_{out}$ is performed in the interpolator 7. This is illustrated in FIG. 8. The sampled values A at the sampling times $t_1, t_3, \ldots t_{10}$ correspond to the input signal string $s_{in}$, while the sampled values A at the sampling times $t'_1, t'_2, \ldots t'_6$ correspond to the output signal string $s_{out}$.

In the illustrated case of down-sampling, the interpolator 7 is followed by a buffer store 6 that is implemented in the embodiment as a FIFO (first-in-first-out). In particular, the buffer store 6 serves during a transient phase to buffer the sampled values generated by the interpolator 7 that are taken out at the output of the buffer store 6 at the clock $f_{out}$. The goal of the present invention is to keep the fill level of the buffer store 6 exactly constant and to avoid variations in the fill level of the buffer store 6. The interpolator 7 is thus not regulated on the basis of fill level detection of the buffer store 6 as in the prior art, since such regulation can only intervene when the fill level of the buffer store 6 has changed by at least 1. Instead, regulation in accordance with the invention is based on an estimation of the sampling rate ratio $R=f_{in}/f_{out}$ and an additional estimation of the phase angle $\phi$ of the output sampling rate $f_{out}$ with reference to the input sampling rate $f_{in}$.

In order to determine the sampling rate ratio R, the input sampling rate $f_{in}$ is fed to a counter 8 whose output is sampled at a sampling element 9 at the output sampling rate $f_{out}$. The signal thus produced passes through a first-order cascaded integrator-comb filter (CIC filter) 10 in this example. This CIC filter 10 is followed by an estimator 11 for estimating the sampling rate ratio R and the phase angle $\phi$. The estimator 11 evaluates each set of N sampled values, and at the end of each such observation interval of length N generates an estimate $R_k$ for the sampling rate ratio $f_{in}/f_{out}$ and for the phase $\phi_k$ for the phase angle position of the output clock $f_{out}$. These estimates are fed to a regulating unit 12 which generates a control signal $R_{TC,k}$ therefrom. This control signal $R_{TC,k}$ is fed to a timing control unit 13 that generates a time-shift signal Offset that identifies the sampling times $t'_1, t'_2, \ldots t'_6$ of the output signal string $s_{out}$ relative to the sampling times $t_1, t_2, \ldots t_{10}$ of the input signal string $s_{in}$, and generates an indicator signal E that identifies whether or not a sampling time of the output signal string $s_{out}$ is present during a specific sampling interval of the input signal string $s_{in}$.

The individual elements of the resampler 1 in accordance with the invention shown in FIG. 2 are described in detail below.

Figure 3:
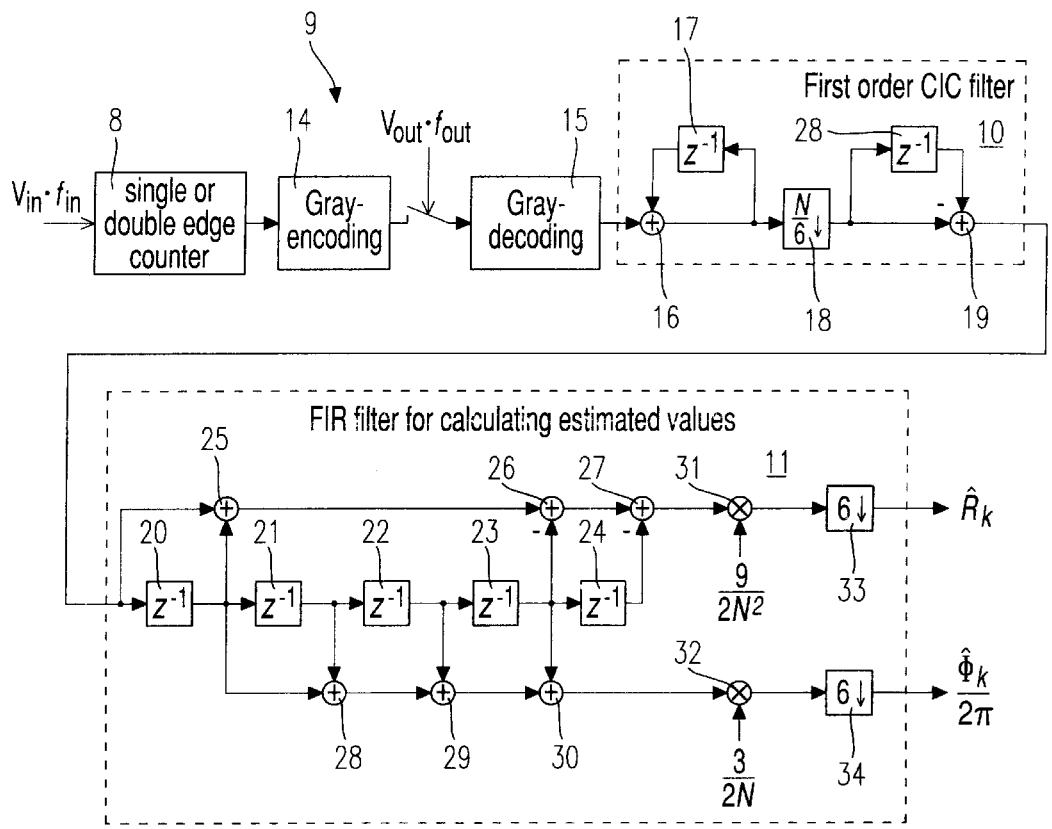
FIG. 3 is a block diagram of a detailed section of the resampler of the invention for determining a sampling rate ratio and a phase angle.

FIG. 3 shows a block diagram of the elements for obtaining the sampling rate ratio R, the CIC filter 10 as well as the estimator 11.

In the case of down-sampling illustrated in FIG. 2, the input sampling rate $f_{in}$ is fed to the counter 8, which can be structured as a single edge counter or double edge counter. The target values from the counter 8 are fed to a Gray encoder 14, which performs a Gray encoding of the target values. Gray encoding has the known property that only one respective bit changes during an increment or decrement. An error in the subsequent sampling in the sampling element 9 at the output sampling rate $f_{out}$ is thus a maximum of 1 bit. The Gray encoding is reversed in the Gray decoder 15 that follows. The Gray encoder 14 and the Gray decoder 15 are optional and can also be omitted. The sampling rate ratio can also be determined by means other than a counter-sampler. In the case of up-sampling, the functions of $f_{in}$ and $f_{out}$ are exchanged.

In the embodiment illustrated, the output signal of the Gray decoder 15 is fed to the first-order CIC filter 10. In a first stage including an adder 16 and a delay element 17, the sampled values are continuously totaled. In a sampling converter 18, the sampling rate in the embodiment is decreased by a factor of 6, that is only every sixth value of the output of the adder 16 is selected for further processing. In a second stage including a subtracter 19 and a delay element 28, the first value of each block of length N/6 is subtracted from the last value, which is to say that the values at the output of the CIC filter 10 each represent the blockwise total of N/6 sampled values. These blockwise total values are fed to the estimator 11. N represents the length of the intended observation interval of the estimator 11.

The estimator 11 includes a chain of a plurality of delay elements 20, 21, 22, 23 and 24. Selected initial, intermediate and final values of this delay chain 20–24 are fed to adders 25, 26 and 27 for calculating the estimated values for the sampling rate ratio and to further adders 28, 29 and 30 for calculating the estimated values for the phase. An appropriate scaling is performed in multipliers 31 and 32 before a reduction of the sampling rate by the remaining value 6 takes place in each sampling converter 33 and 34 so that an estimated value $R_k$ for the sampling rate ratio, and an estimated value normalized to $2\pi$ for the phase $\phi_k/2\pi$, are available at the output of the estimator 11 after each observation interval including N input values.

The precise method of operation of the estimator shown in FIG. 3 is described in detail in patent application DE 100 39 666 A1 of the same assignee and the same inventor. The content of this patent application DE 100 39 666 A1 is incorporated by reference in full in the present application.

Figure 4:
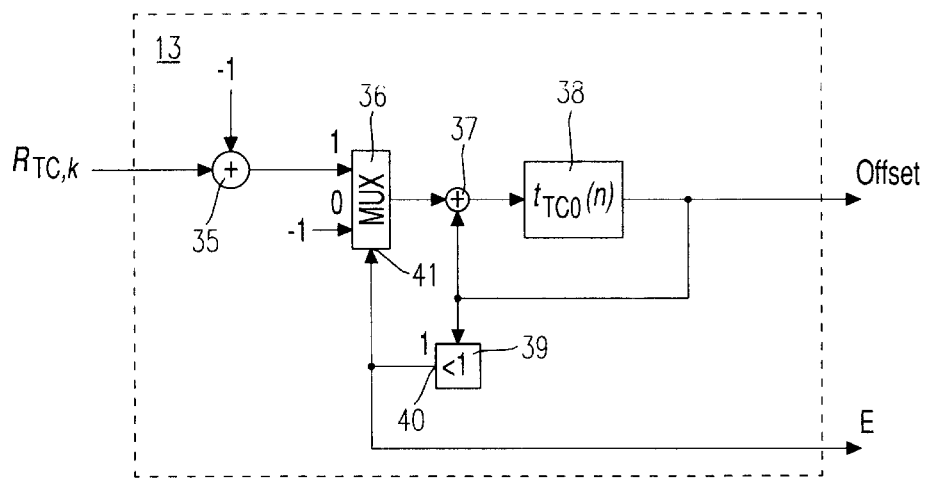
FIG. 4 is a block diagram of the timing control unit of the resampler in accordance with the invention.

FIG. 4 shows a block diagram of the timing control unit 13. The regulating unit 12 produces a control signal $R_{TC,k}$ from the estimates of the sampling rate ratio $R_k$ and of the phase $\phi_k$ in a manner that will be described in detail using FIG. 5; this control signal being fed to the timing control unit 13. The control signal $R_{TC,k}$ is reduced by one in an adder 35. It is the task of the timing control unit 13 to provide the interpolator 7 with a time-shift signal (Offset) that characterizes the sampling times $t'_1, t'_2, \ldots t'_6$ of the output signal string $s_{out}$ relative to the sampling times $t_1, t_2, \ldots t_{10}$ of the input signal string $s_{in}$. In this regard, the sampling period of the input signal string $s_{in}$ in the embodiment is normalized to one. In the case of a different normalization, the appropriate normalization quantity would be subtracted instead of 1. In addition, the control unit 13 generates an indicator signal E, which indicates to the interpolator 7 whether a sampling time of the output signal string $s_{out}$ is present during the next sampling period of the input signal string $s_{in}$.

The output of the adder 35 is connected to a switching device (multiplexer MUX) 36. When the switching device 36 receives a logic "1" at its switching input 41, it connects its output to the adder 35. Otherwise its output is connected to the other input, which is continuously supplied with the value −1. The output of the switching device 36 is connected to an adder 37. The output of the adder 37 is connected to a delay element 38 that shifts each of the digital values by one sampling period $t_{TC0}(n)$, for example $t_2-t_1$, of the input signal string $s_{in}$. The output of the delay element 38 is connected to the second input of the adder 37 and to a detector 39. The detector 39 determines whether the current output value of the delay element 38 is greater than or less than 1. If the current output value of the delay element 38 is less than 1, the detector 39 produces a logic "1" at its output 40; otherwise it produces a logic "0". Hence if the current output value of the delay element 38 (register) is less than 1, the value $R_{TC,k}-1$ is applied to the input of the adder 37; otherwise the value −1 is applied to the input of the adder 37 via the switching element 36. The output values of the delay element 38 form the time-shift signal Offset, whereas the output values of the detector 39 form the indicator signal E.

The method of operation of the timing control unit 13 shown in FIG. 4, and that of the interpolator 7, are described below with reference to FIG. 8. FIG. 8 shows a signal of the amplitude A, which is sampled in accordance with the input signal string $s_{in}$ at times $t_1, t_2, t_3, t_4, t_5, t_6, t_7, t_8, t_9$ and $t_{10}$. After resampling in the resampler 1, the signal is sampled at times $t'_1, t'_2, t'_3, t'_4, t'_5$ and $t'_6$. The time positions of the sampling times $t'_1, t'_2, \ldots t'_6$ of the output signal string $s_{out}$ relative to the sampling times $t_1, t_2, \ldots t_{10}$ of the input signal string $s_{in}$ is indicated to the interpolator 7 by the timing control unit 13 by means of the time-shift signal Offset and the indicator signal E.

In the example shown in FIG. 8, it is assumed that the control signal $R_{TC,k}=5/3$. The control signal $R_{TC,k}$ is essentially the sampling rate ratio $R=f_{in}/f_{out}$ that is however regulated according to this invention on the basis of the phase estimate in a manner that will be described in detail using FIGS. 5 through 7. It is further assumed that the starting value in the delay element (register) 38 for the time-shift signal Offset=2/3. Since 2/3 <1, the indicator signal E=1. For the interpolator 7, this means that a sampled value of the output signal string $s_{out}$ must be generated by interpolation at a sampling time $t'_1$ that lies 2/3 of a sampling period of the input signal string $s_{in}$ later than the time $t_1$.

The switching device 36 connects the input of the adder 37 with the adder 35 so that the value $R_{TC,k}-1=2/3$ is added to the register state of the delay element (register) 38 and the value Offset=4/3 now appears at the output of the delay element (register) 38. Since it is true that 4/3>1, the output of the detector 39 is now "0", and because of this state of the indicator signal E=0, the interpolator 7 performs no interpolation between $t_2$ and $t_3$. On the following clock, as a result of the logic state "0" of the output of the detector 39, −1 is applied to the input of the adder 37 and the signal Offset at the output of the delay element (register) 38 becomes Offset=1/3. Since it is true that 1/3<1, the indicator signal becomes E=1 The interpolator 7 thus performs an interpolation at a position shifted after the time $t_3$ by 1/3 of the sampling period of the input signal string $S_{in}$, hence at the position $t_2$ in FIG. 8, to generate the next value of the output signal string $S_{out}$.

On the next clock pulse, the value $R_{TC,k}-1=2/3$ is again applied to the adder 37 so that the output of the delay element (register) assumes the value 3/3=1. The output of the detector 39 is hence "0", and the indicator signal E=0, so no interpolation takes place between the times $t_4$ and $t_5$. On the next clock pulse, −1 is applied to the input of the adder 37 and the output of the delay element (register) 38 becomes 0. Since the indicator signal E is set to "1" by the detector 39, the next interpolation then takes place at time $t'_3=t_5$. The sequence continues as shown in FIG. 8. In the timing control unit 13, $R_{TC,k}$ is always used for generating $N/V_{out}$ output values.

The structure and operation of an embodiment of the regulating unit 12 are described in more detail below using FIGS. 5 through 7.

Figure 5:
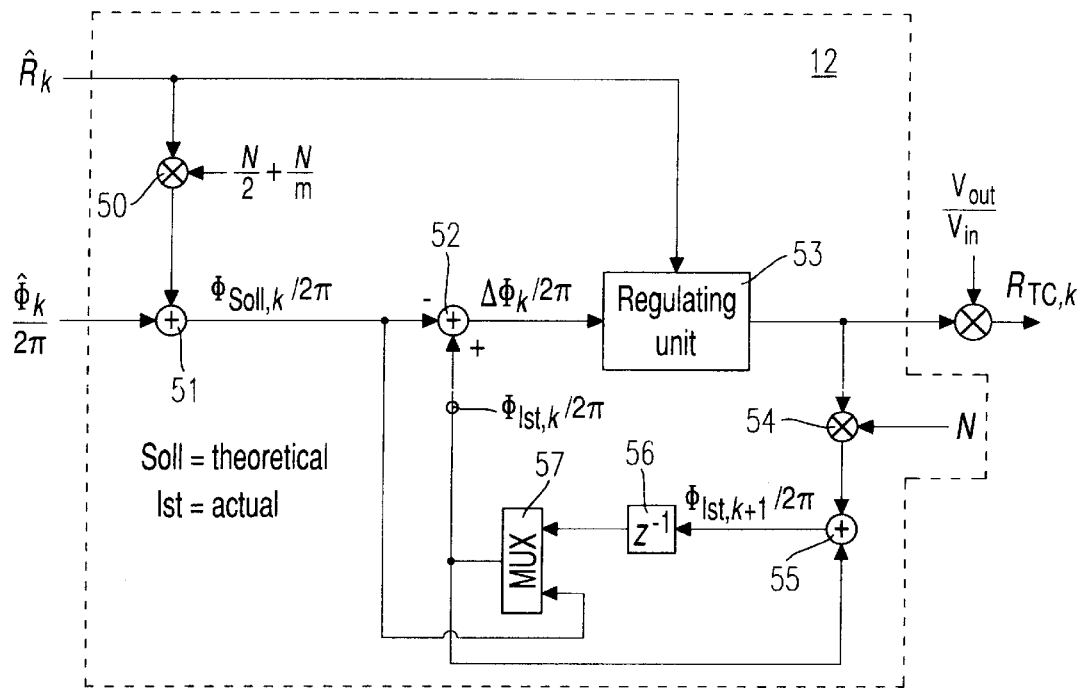
FIG. 5 is a block diagram of a regulating device of the resampler in accordance with the invention.

FIG. 5 shows an embodiment of the regulating unit 12. After each observation interval, the regulating unit 12 is supplied with an estimated value for the sampling rate ratio $R_k$ and an estimated value normalized to $2\pi$ for the phase $\phi_k/2\pi$. The index k indexes the observation intervals that are illustrated in FIG. 7. In the example shown in FIG. 7, each observation interval includes six sampled values on the clock $f_{out}$ of the output signal string $S_{out}$. In the embodiment of the estimating unit 11 shown in FIG. 3, the estimation respectively takes place at the midpoint of each observation interval. However, for regulation an estimate is needed at the start of the next observation interval. Consequently, a phase offset of $N/2 \cdot R_k$ must be added to the estimated value $\phi_k/2\pi$, which is illustrated in FIG. 7 in the center row.

In the embodiment shown in FIG. 5, an additional phase offset of $N/m \cdot R_k$ is added, where m can be m=12, for example. The purpose of this additional offset is to ensure, even in the case of the largest regulator deviation that can be expected, that the resulting setpoint phase $\phi_{set,k}$ does not lie before the beginning of the next observation interval. In the embodiment depicted, the aforementioned phase shift is produced by a multiplier (50), which can also be implemented as a bit shift operation (bit shifter) if the phase shift is chosen appropriately, and an adder 51.

The phase $\phi_{set,k}/2\pi$, normalized to $2\pi$, is compared with the actual phase $\phi_{actual,k}/2\pi$, normalized to $2\pi$, at the beginning of the next observation interval. The deviation $\Delta\phi_k/2\pi$, is determined in a subtracter 52 and is supplied to a regulator 53. Also supplied to the regulator 53 are the estimated values for the sampling rate ratio $R_k$. The regulator 53 works in such a way that the control signal $R_{TC,k}$ produced at the output of the regulator 53 corresponds essentially to the sampling rate ratio $R_k$ estimated in the preceding observation interval, yet this is slightly modified, based on the control variable $\Delta\phi_k/2\pi$, in such a way that the control signal $R_{TC,k}$ achieves the result that, at the end of the observation interval to be regulated, the actual phase $\phi_{actual,k}$ agrees with the setpoint phase $\phi_{set,k}$. Ideally, in the steady state of the regulator, $R_k$ agrees with the control signal $R_{TC,k}$.

The actual phase $\phi_{actual,k}$, normalized to $2\pi$, of the output signal string $S_{out}$ is formed in such a way that the control signal $R_{TC,k}$, which represents the actual sampling rate ratio used by the timing control unit 13, is multiplied by the observation duration N in a multiplier 54. Here, too, the multiplier 54 can be replaced by a bit shift operation (bit shifter) in order to avoid actual multiplication. In this way, the phase shift is determined during the $k^{th}$ observation interval and supplied to the adder 55, whose output is connected to a delay element 56 (register), which each time effects a shift by the length of one observation interval. Except during initialization, which is described below, the switching element 57 is always switched such that its output is connected to the delay element 56. Consequently, the output of the delay element 56 is returned to one of the inputs of the adder 55. Since the output of the delay element (register) 56 represents the actual phase $\phi_{actual,k}$ at the start of the $K^{th}$ observation interval, the actual phase $\phi_{actual,k}$ at the beginning of the $k+1^{st}$ observation interval $\phi_{actual,k+1}/2\pi$ is calculated by adding the phase $\phi_{actual,k}$ at the beginning of the $K^{th}$ observation interval to the phase shift produced during the $K^{th}$ observation interval. The actual phase is thus continually updated by taking into account the phase shift occurring in the respective then-current observation interval.

At the start of the regulation, the actual phase is not known. Consequently, at the start of regulation during initialization, the output of the adder 51 is connected to the +input of the subtracter 52 through the switching element (multiplexer MUX) 57, so that the control variable $\Delta\phi_k/2\pi$ is initially 0 because of the identity of the input signals of the subtracter 52.

Figure 6:
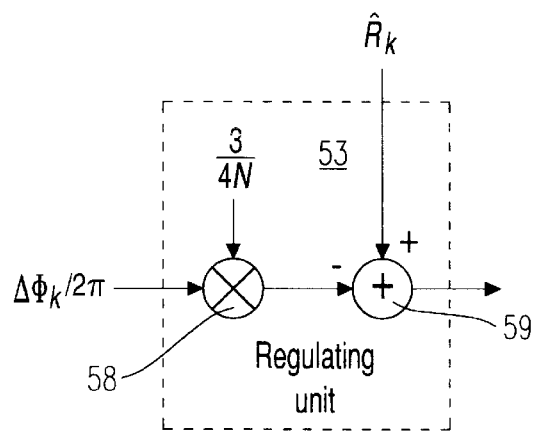
FIG. 6 is a detailed representation of the regulator of the regulating device shown in FIG. 5.

FIG. 6 shows an embodiment of the regulator 53. In this embodiment, the regulator 53 takes the form of a proportional controller, that is, the change made in the estimated sampling rate ratio $R_k$ is proportional to the control variable $\Delta\phi_k/2\pi$, where the proportionality factor in the embodiment shown is 3/4N. The proportionality factor and the control variable $\Delta\phi_k/2\pi$ are fed to a multiplier 58, which can be implemented as a bit shift operation (bit shifter) if the proportionality factor is chosen appropriately. The actual regulation is accomplished by a subtracter 59, to which are fed the output of the multiplier 58 and the estimated values of the sampling rate ratio $R_k$.

Figure 7:
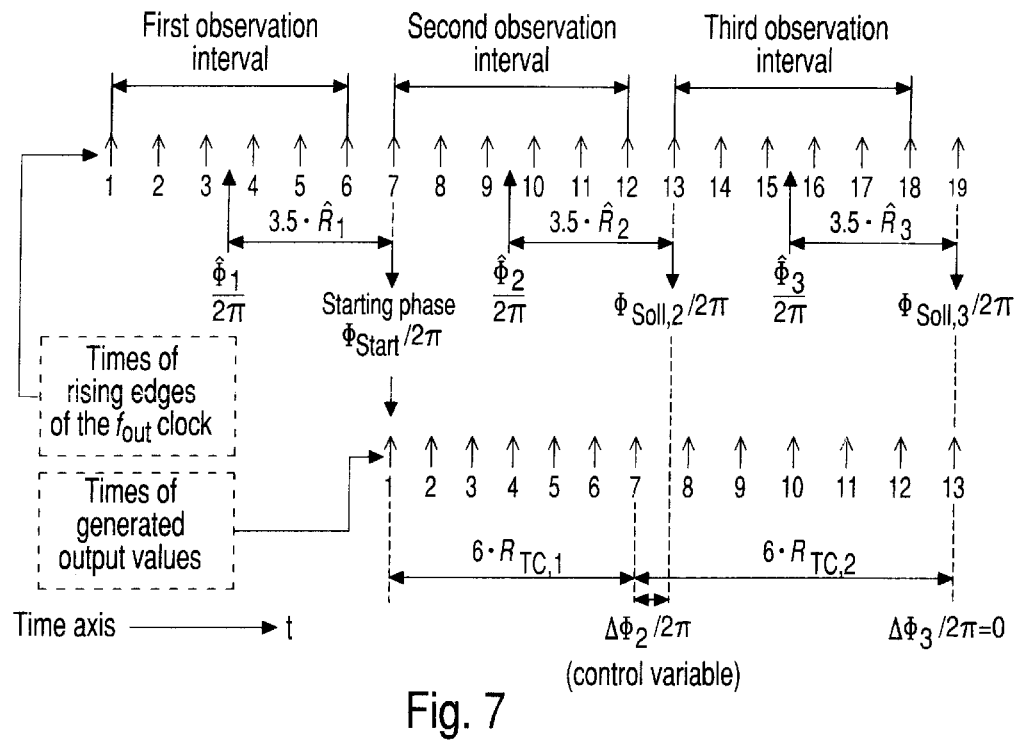
FIG. 7 is a diagram explaining the method of operation of the regulating device shown in FIG. 5.

The method of operation of the regulating unit 12 shown in FIG. 5 is described in more detail using FIG. 7. In the first row of FIG. 7, the sampling times of the output signal string $S_{out}$, which are represented for example by the rising edges of the $f_{out}$ clock pulses, are illustrated by arrows. In the second row, it is indicated in each case that the estimating unit 11 determines an estimate normalized to $2\pi$ for the phase $\Delta\phi_k/2\pi$ for the midpoint of each observation interval. In order to obtain the phase for the output clock $f_{out}$ at the beginning of each subsequent observation interval, each phase in this example must be shifted by $3.5 \cdot R_k$. This results in the setpoint phase $\phi_{set,k}$ at the start of the next observation interval.

In the first observation interval, no regulation can be performed yet since the estimates $R_1$ and $\phi_1$ are determined for the first time during this observation interval. In the second observation interval, the starting phase $\phi_{start}/2\pi$ is established by the switching device (multiplexer) 57 that is used to initialize the actual phase of the regulating device 12. At the end of the second observation interval, the control variable $\Delta\phi_2/2\pi$, which represents the deviation of the actual phase from the setpoint phase at the end of the second observation interval, can be determined for the first time. In the example illustrated in FIG. 7, the clock $f_{out}$ during the second observation interval was too long. The clock $f_{out}$ is reduced during the third observation interval such that ideally the actual phase agrees exactly with the setpoint phase at the end of the third observation interval.

The regulation unit in accordance with the invention continuously corrects the sampling rate ratio, especially when there is a change in the input sampling rate $f_{in}$ or the output sampling rate $f_{out}$. A change in the fill level of the buffer store (FIFO) 6 can be avoided in the steady state of the regulator, so that no relatively large changes in the group propagation-time delay through the resampler 1 occur.

The invention is not limited to the embodiment shown. In particular, the estimating unit 11 can also be configured differently from that shown in FIG. 3. Other implementations of the regulating unit 12 and the time control unit 13 than those shown in FIGS. 4 and 5 are also conceivable. The invention can also find application for a resampler 1 in up-sampling operation, wherein the functions of $f_{in}$ and $f_{out}$ in FIG. 2 must be exchanged and the buffer store (FIFO) 6 must be placed ahead of the interpolator 7.

We claim:

1. Device for converting a digital input signal string with an input sampling rate into a digital output signal string with an output sampling rate, including:
   an estimating unit that estimates a sampling rate ratio between the input sampling rate and the output sampling rate and a setpoint phase of the output signal string,
   a regulating unit that is connected to the estimating unit and which compares the actual phase of the output signal string with the setpoint phase of the output signal string, and generates a control signal as a function of the estimated sampling rate ratio and the deviation of the actual phase from the setpoint phase, and
   an interpolator that interpolates the input signal string for producing the output signal string at the sampling times, whose temporal position is determined by the control signal.

2. Device according to claim 1, wherein the regulating unit includes a regulator that increasingly raises or lowers the sampling rate ratio with increasing deviation of the actual phase from the setpoint phase to generate the control signal.

3. Device according to claim 2, wherein the regulator is a proportional controller that raises or lowers the sampling rate ratio proportionately to the deviation of the actual phase from the setpoint phase.

4. Device according to claim 1, wherein the estimating unit estimates the phase of the output signal string at the midpoint of each observation interval upon which the estimate is based, and an adder is provided that adds a phase offset corresponding to half the length of the observation interval and another phase offset that is greater than the maximum expected deviation of the actual phase from the setpoint phase.

5. Device according to claim 1, wherein the regulating unit includes a switching device that, during a first regulating period, supplies the setpoint phase to a subtracter, and during subsequent regulating periods supplies the actual phase delayed by an observation interval in a delay element.

6. Device according to claim 1, wherein there is a timing control unit between the regulating unit and the interpolator that generates from the control signal a time-shift signal that identifies sampling times of the output signal string relative to sampling times of the input signal string, and generates an indicator signal that identifies if a sampling time of the output signal string is present during a specific sampling interval of the input signal string.

7. Device according to claim 6, wherein the timing control unit includes an adder whose output is connected to an input of a delay element and whose first input is connected to the output of the delay element, wherein the output of the delay element is connected to a detector, which determines whether the output value of the delay element is less than a scaled sampling period of the input signal string, and wherein the control signal, which has been reduced by the scaled sampling period, is fed to the second input of the adder when the detector determines that the output value of the delay element is less than the scaled sampling period of the input signal string, and the scaled sampling period is supplied to the second input of the adder when the detector determines that the output value of the delay element is greater than or equal to the scaled sampling period of the input signal string.

8. Device according to claim 7, wherein the time-shift signal is taken from the output of the delay element and the indicator signal is taken from the output of the detector.

9. Method for converting a digital input signal string with an input sampling rate into a digital output signal string with an output sampling rate, having the following process steps:
   estimating the sampling rate ratio between the input sampling rate and the output sampling rate, and the setpoint phase of the output signal string,
   comparing the actual phase of the output signal string with the setpoint phase of the output signal string,
   generating a control signal as a function of the estimated sampling rate ratio and the deviation of the actual phase from the setpoint phase, and interpolating the input signal string to generate the output signal string at sampling times whose temporal position is specified by the control signal.

10. Method in accordance with claim 9, wherein the sampling rate ratio is increasingly raised or lowered with increasing deviation of the actual phase from the setpoint phase to generate the control signal.

11. Method in accordance with claim 9, wherein the phase of the input signal string is estimated at the midpoint of each observation interval upon which the estimate is based, and a phase offset that corresponds to half the length of the observation interval, and another phase offset that is greater than the maximum expected deviation of the actual phase from the setpoint phase, are added to the estimated phase.

12. Method in accordance with claim 9, wherein a timing control takes place for controlling the sampling times of the output signal string, and a time-shift signal that identifies the sampling times of the output signal string relative to the sampling times of the input signal string, and an indicator signal that identifies whether a sampling time of the output signal string is present during a specific sampling interval of the input signal string, are generated from the control signal.

* * * * *